US008483332B2

(12) United States Patent
Kobayashi

(10) Patent No.: US 8,483,332 B2
(45) Date of Patent: Jul. 9, 2013

(54) OSCILLATING APPARATUS, RECEIVING APPARATUS, AND OSCILLATION CONTROL METHOD

(75) Inventor: Hiroki Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 977 days.

(21) Appl. No.: 12/402,613

(22) Filed: Mar. 12, 2009

(65) Prior Publication Data

US 2009/0304129 A1     Dec. 10, 2009

(30) Foreign Application Priority Data

Jun. 5, 2008   (JP) ................................ 2008-148210

(51) Int. Cl.
*H04L 27/06* (2006.01)

(52) U.S. Cl.
USPC ............... 375/344; 331/34; 334/13; 334/26; 348/735; 455/75; 455/136; 455/173.1; 455/255; 455/256; 455/257; 455/258; 455/259; 455/260; 455/261; 455/262; 455/263; 455/264; 455/265; 455/313; 455/316; 455/323

(58) Field of Classification Search
USPC ........... 375/344, 375; 334/13, 17, 26; 455/75, 455/136, 173.1, 255, 256, 257, 258, 259, 455/260, 261, 262, 263, 264, 265, 313, 323; 331/13, 17, 26, 34; 348/735
See application file for complete search history.

(56) References Cited

U.S. PATENT DOCUMENTS

| 5,659,586 | A | 8/1997 | Chun | |
|---|---|---|---|---|
| 6,570,947 | B1 | 5/2003 | Zipper et al. | |
| 7,177,602 | B2 * | 2/2007 | Ziren et al. | 455/75 |
| 7,453,962 | B2 * | 11/2008 | Lee et al. | 375/344 |
| 7,471,937 | B2 * | 12/2008 | Simmons et al. | 455/173.1 |
| 2002/0036545 | A1 | 3/2002 | Fridi et al. | |
| 2003/0114110 | A1 * | 6/2003 | Dahlback et al. | 455/67.1 |
| 2006/0114069 | A1 * | 6/2006 | Kojima et al. | 331/16 |
| 2007/0202928 | A1 * | 8/2007 | Landau et al. | 455/567 |

FOREIGN PATENT DOCUMENTS

| JP | 62-169527 | 7/1987 |
|---|---|---|
| JP | 01-293011 | 11/1989 |
| JP | 03-119829 | 5/1991 |
| JP | 05-048393 | 2/1993 |
| JP | 08-018966 | 1/1996 |

(Continued)

OTHER PUBLICATIONS

Frey "Lecture Notes for Analog Electronics". Dec. 1999, pp. 2-3.*

(Continued)

*Primary Examiner* — Sophia Vlahos
(74) *Attorney, Agent, or Firm* — Fujitsu Patent Center

(57) ABSTRACT

In an oscillating apparatus, a detection unit detects a frequency offset between an input signal and a reference signal. A code generation unit specifies a relationship among a code having a predetermined number of bits, the frequency offset, and a voltage to be applied to a voltage-controlled oscillator by a DAC, in accordance with a frequency offset detection state of the detection unit. The code generation unit also generates a frequency offset correction code having a predetermined number of bits in accordance with the specified relationship. The DAC applies the voltage to the voltage-controlled oscillator, in accordance with the relationship described above and the code generated by the code generation unit. The voltage controlled oscillator outputs an oscillator signal having an oscillation frequency corresponding to the voltage applied by the DAC.

10 Claims, 15 Drawing Sheets

FOREIGN PATENT DOCUMENTS

| | | |
|---|---|---|
| JP | 08-154108 | 6/1996 |
| JP | 08-505508 | 6/1996 |
| JP | 11-205405 | 7/1999 |
| JP | 2002-118460 | 4/2002 |
| JP | 2006-500807 | 1/2006 |
| WO | WO95/12253 A1 | 5/1995 |
| WO | WO2004/027992 A1 | 4/2004 |
| WO | 2006/023777 | 3/2006 |

OTHER PUBLICATIONS

European Search Report dated Aug. 20, 2009, from the corresponding European Application.

"Japanese Office Action" mailed by JPO and corresponding to Japanese application No. 2008-148210 on Jul. 10, 2012, with partial English translation.

Japanese Office Action mailed Mar. 19, 2013 for corresponding Japanese Application No. 2008-148210, with English-language translation.

\* cited by examiner

CODE CONVERSION TABLES

170a: 0.5 – 1.5V

| No. | CFO (ppm) | code |
|---|---|---|
| 1 | −10 | 0 |
| 2 | −9.961 | 1 |
| 3 | −9.922 | 2 |
| ... | ... | ... |
| 256 | 0 | 255 |

170b: 1.0 – 2.0V

| No. | CFO (ppm) | code |
|---|---|---|
| 1 | −5 | 0 |
| 2 | −4.961 | 1 |
| 3 | −4.922 | 2 |
| ... | ... | ... |
| 256 | 5 | 255 |

170c: 1.5 – 2.5V

| No. | CFO (ppm) | code |
|---|---|---|
| 1 | 0 | 0 |
| 2 | 0.039 | 1 |
| 3 | 0.078 | 2 |
| ... | ... | ... |
| 256 | 10 | 255 |

FIG. 7

CODE CONVERSION TABLES

0.5 – 1.0V (170d)

| No. | CFO (ppm) | code |
|---|---|---|
| 1 | −10 | 0 |
| 2 | −9.9805 | 1 |
| 3 | −9.961 | 2 |
| ... | ... | ... |
| 256 | −5 | 255 |

1.0 – 1.5V (170e)

| No. | CFO (ppm) | code |
|---|---|---|
| 1 | −5 | 0 |
| 2 | −4.9805 | 1 |
| 3 | −4.961 | 2 |
| ... | ... | ... |
| 256 | 0 | 255 |

1.5 – 2.0V (170f)

| No. | CFO (ppm) | code |
|---|---|---|
| 1 | 0 | 0 |
| 2 | 0.0195 | 1 |
| 3 | 0.039 | 2 |
| ... | ... | ... |
| 256 | 5 | 255 |

2.0 – 2.5V (170g)

| No. | CFO (ppm) | code |
|---|---|---|
| 1 | 5 | 0 |
| 2 | 5.0195 | 1 |
| 3 | 5.039 | 2 |
| ... | ... | ... |
| 256 | 10 | 255 |

FIG. 11

OSCILLATING APPARATUS, RECEIVING APPARATUS, AND OSCILLATION CONTROL METHOD

CROSS-REFERENCE TO RELATED APPLICATIONS

This application is based upon and claims the benefit of priority of the prior Japanese Patent Application No. 2008-148210, filed on Jun. 5, 2008, the entire contents of which are incorporated herein by reference.

FIELD

The embodiments discussed herein are related to oscillating apparatuses, receiving apparatuses, and oscillation control methods.

BACKGROUND

In radio communication systems that are widely used at present, a transmitting apparatus (such as a radio base station) sends data to a receiving apparatus (such as a mobile station) by radio. The transmitting apparatus performs radio communication by using part or all of a predetermined frequency band (system band) in the radio communication system. The receiving apparatus extracts data from a received signal by generating internally an oscillator signal synchronized with the signal received from the transmitting apparatus.

The frequency of the radio signal received by the receiving apparatus may depend on the remote transmitting apparatus or may vary with the state of the radio propagation path. Accordingly, the receiving apparatus can perform automatic frequency control (AFC) to adjust the frequency of the internal oscillator signal. In AFC, any difference in frequency (frequency offset) is detected through a comparison between the frequency of the received signal and the frequency of the reference signal (feedback signal of the oscillator signal, for instance), and the oscillation frequency is adjusted in accordance with the detected frequency offset.

An oscillator signal of a desired frequency can be obtained by using a voltage controlled oscillator (VCO). In this method, the receiving apparatus converts the detected frequency offset to a voltage and applies the obtained voltage to the VCO, thereby adjusting the oscillation frequency of the VCO.

The receiving apparatus can adjust the phase while adjusting the frequency. For the phase adjustment, a phase locked loop (PLL) circuit is used, for example. A known technology reduces the time needed to adjust the frequency or phase. To be more specific, the technology conducts phase adjustment in two stages: Open loop and closed loop (see Japanese Laid-open Patent Publication No. 2002-118460, for instance).

If the frequency offset is detected by digital processing, conversion from the detected frequency offset to voltage accompanies digital-to-analog conversion. In one possible method, the detected amount of frequency offset (a value within the range of −10 to +10 parts per million (ppm), for instance) is converted to a code having a predetermined number of bits (an eight-bit code that can represent "0" to "255," for instance), and the code is converted to voltage by a digital-to-analog converter (DAC).

Generally available DACs, however, have a fixed relationship between input code and output voltage as predetermined in accordance with the design specifications. Accordingly, in the conventional conversion method, the resolution of digital-to-analog conversion could cause a bottleneck, making it impossible to raise the precision of oscillation frequency adjustment sufficiently. The amount of change in voltage output from the DAC corresponding to an increment of "1" in input code determines the limit of precision of oscillation frequency adjustment.

SUMMARY

According to an aspect of the embodiments, to accomplish the above object, there is provided an oscillating apparatus which controls an oscillation frequency by detecting a frequency offset between an input signal and a reference signal, converting the frequency offset to a code having a predetermined number of bits, converting the code having the predetermined number of bits to a voltage, and applying the voltage to a voltage controlled oscillator. This oscillating apparatus includes a voltage control unit which specifies a relationship among the code having the predetermined number of bits, the frequency offset, and the voltage, in accordance with a detection state of the frequency offset.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 7 illustrates example data of code conversion tables of the first embodiment;
FIG. 11 illustrates example data of code conversion tables of a second embodiment.

DESCRIPTION OF EMBODIMENT(S)

Figure 1:
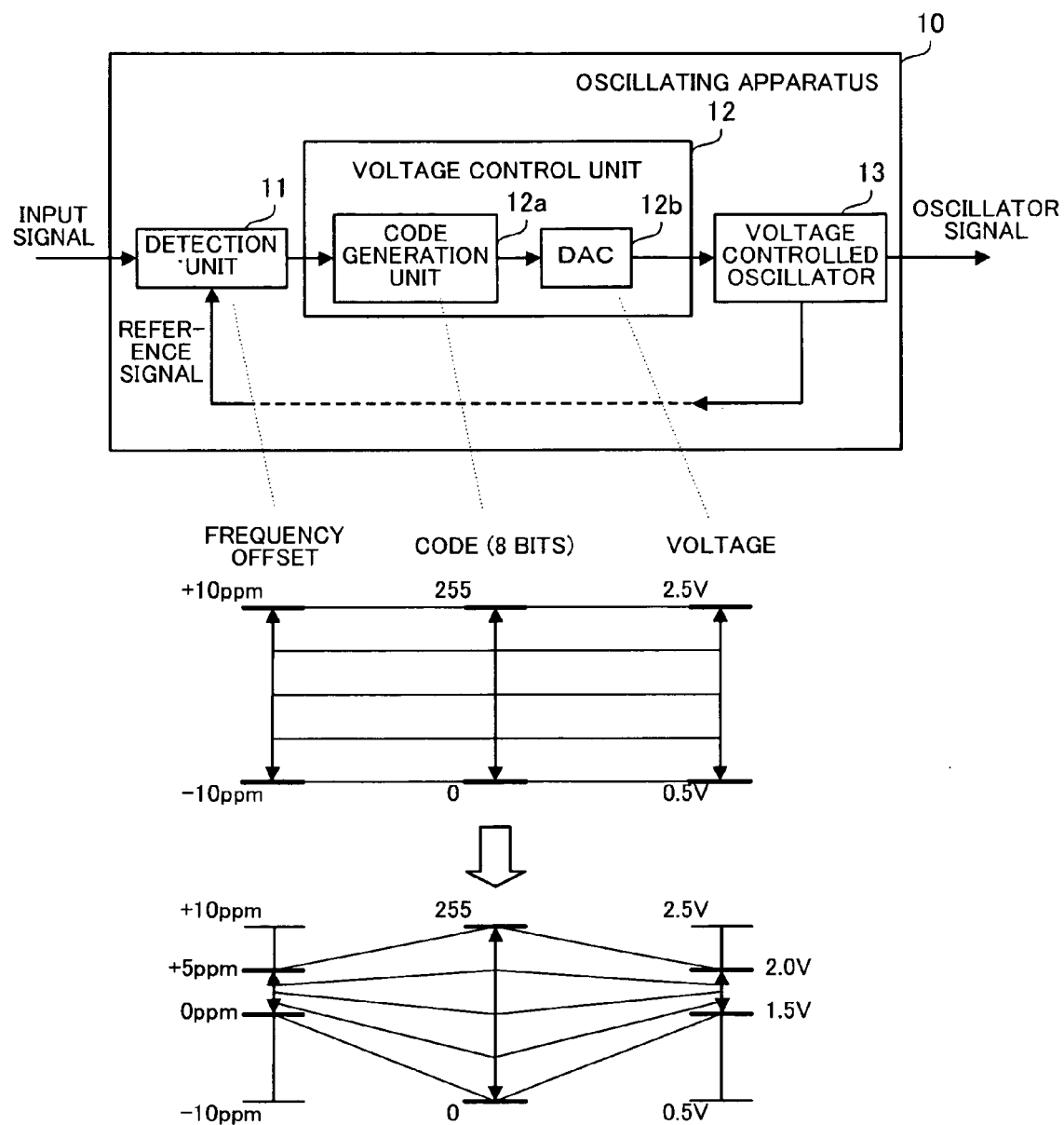
FIG. 1 illustrates an outline of embodiments.

Embodiments of the present invention will be explained below with reference to the accompanying drawings, wherein like reference numerals refer to like elements throughout.

FIG. 1 illustrates an outline of the embodiments. An oscillating apparatus 10 illustrated in FIG. 1 brings an oscillator signal output by a voltage controlled oscillator into frequency synchronization with an input signal.

The oscillating apparatus 10 includes a detection unit 11, a voltage control unit 12, and a voltage controlled oscillator 13.

The detection unit 11 detects a frequency offset between the received signal and the reference signal. The detection unit 11 detects the frequency offset by digital processing. The detection unit 11 outputs the detected frequency offset to the voltage control unit 12.

The voltage control unit 12 includes a code generation unit 12a and a DAC 12b.

The code generation unit 12a obtains the frequency offset from the detection unit 11 and specifies a relationship between the range of voltage output from the DAC 12b and codes having a predetermined number of bits. The code generation unit 12a also generates a code having the predetermined number of bits in accordance with the frequency offset. The code generation unit 12a outputs the generated code to the DAC 12b.

The DAC 12b obtains the code from the code generation unit 12a and outputs to the voltage controlled oscillator 13 the code and a voltage corresponding to the voltage range specified by the code generation unit 12a.

The voltage controlled oscillator 13 controls an oscillation frequency in accordance with the voltage applied by the DAC 12b and outputs an oscillator signal. The oscillator signal is returned to the detection unit 11 and used as a reference signal.

In the oscillating apparatus 10, the detection unit 11 detects a frequency offset within a range of −10 to +10 ppm, for instance, and the DAC 12b is specified to output voltage within a range of 0.5 to 2.5 V for the frequency offset. Suppose that the code generation unit 12a generates an eight-bit code that can represent values ranging from 0 to 255, for example. If the detection unit 11 determines that the range of the detected frequency offset is 0 to +5 ppm, for example, the output voltage range of the DAC 12b is specified to 1.5 to 2.0 V. Then, the code generation unit 12a associates the frequency offset range and the output voltage range to eight-bit codes.

Since the code generation unit 12a associates a variable voltage range with the codes having the predetermined number of bits, a change of "1" in the code input to the DAC 12b can be associated with a small amount of change in voltage output from the DAC 12b. Accordingly, the resolution of voltage applied to the voltage controlled oscillator 13 can be improved, and the precision of oscillation frequency control can be enhanced.

First Embodiment

A first embodiment will be described below in detail with reference to the drawings.

Figure 2:
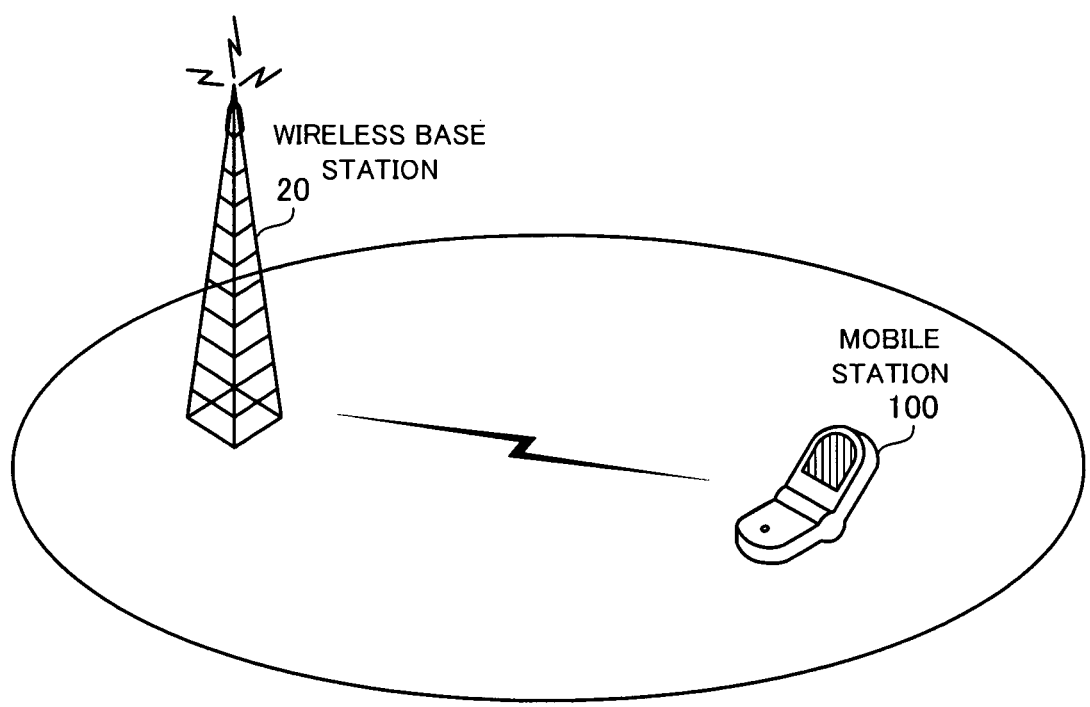
FIG. 2 illustrates the structure of a mobile communication system of a first embodiment.

FIG. 2 illustrates the structure of a mobile communication system of the first embodiment. The mobile communication system illustrated in FIG. 2 includes a wireless base station 20 and a mobile station 100 and allows wireless communication between the wireless base station 20 and the mobile station 100.

The wireless base station 20 is a communication apparatus that performs wireless communication with the mobile station 100.

The mobile station 100 is a wireless terminal that can perform wireless communication with the wireless base station 20.

Data transmission between the wireless base station 20 and the mobile station 100 is performed on the basis of orthogonal frequency division multiplexing (OFDM), for example. In the system, the wireless base station 20 manages frequency resources of a plurality of mobile stations including the mobile station 100, assigns a frequency to be used for communication with the mobile station 100, and communicates with the mobile station 100 by using the assigned frequency.

The mobile station 100 includes a local oscillator. The mobile station 100 converts the frequency of a signal received from the wireless base station 20 from the radio frequency (RF) band to the baseband, by using an oscillator signal having almost the same frequency as the received signal, output from the local oscillator. The local oscillator includes a voltage-controlled, temperature-compensated crystal oscillator (VC-TCXO) and a frequency conversion PLL circuit for radio frequency. The local oscillator can output a high-precision oscillator signal by multiplying a stable reference frequency of the VC-TCXO in the frequency conversion PLL circuit.

An AFC is performed to correct an error in the oscillation frequency of the local oscillator in the mobile station 100. The AFC is implemented by returning the center frequency offset (CFO) detected in the signal received from the wireless base station 20, to the local oscillator. The mobile station 100 can detect the CFO by using the following two methods.

In a first method, a high precision signal in the frequency reference range, contained in a predetermined preamble signal in the baseband signal, is Fourier-transformed and subjected to pattern matching with a known frequency on the frequency axis. This method allows an integer CFO (ICFO), which is an integral multiple of the carrier frequency interval, to be detected.

In a second method, a phase shift amount is calculated by autocorrelation based on a cyclic prefix (CP, which is also referred to as a guide interval) included in the baseband signal. This method allows a fractional CFO (FCFO), which is a fractional multiple (by a factor of −0.5 to 0.5) of the carrier frequency interval, to be detected.

The sum of the ICFO and the FCFO is a CFO.

The mobile station 100 tunes the oscillation frequency of the local oscillator to the frequency of the received signal through the AFC performed by combining the first and second methods described above.

The structure of the mobile station 100 will be described below.

Figure 3:
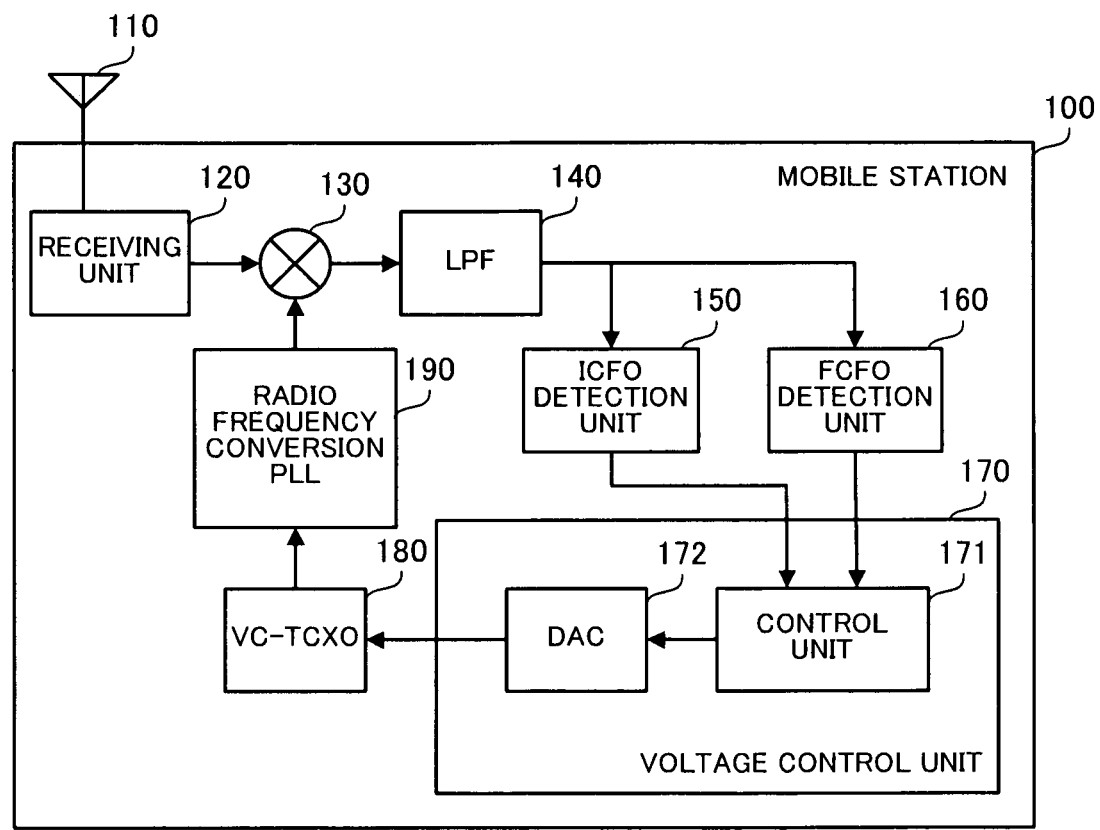
FIG. 3 is a block diagram illustrating the functions of a mobile station of the first embodiment.

FIG. 3 is a block diagram illustrating the functions of the mobile station 100 of the first embodiment. The mobile station 100 includes an antenna 110, a receiving unit 120, a mixer 130, a low pass filter (LPF) 140, an ICFO detection unit 150, an FCFO detection unit 160, a voltage control unit 170, a VC-TCXO 180, and a radio frequency conversion PLL 190.

The antenna 110 receives a signal from the wireless base station 20 and outputs the received signal to the receiving unit 120.

The receiving unit 120 obtains the received signal from the antenna 110. In the receiving unit 120, an RF band pass filter suppresses an interference wave outside a desired band, and the desired signal is amplified and subjected to other processing. The desired RF signal is output to the mixer 130.

The mixer 130 multiplies the received signal obtained from the receiving unit 120 by the oscillator signal input from the radio frequency conversion PLL 190 to make it have a baseband frequency. The mixer 130 outputs the resultant signal to the LPF 140.

The LPF 140 extracts a baseband signal from the signal given by the mixer 130 and outputs the baseband signal to the ICFO detection unit 150 and the FCFO detection unit 160.

The ICFO detection unit 150 detects an ICFO by performing a Fourier transform of the preamble signal included in the obtained baseband signal, at the frequency reference range of the preamble signal and performing pattern matching with a known frequency on the frequency axis. The ICFO detection unit 150 outputs the detected ICFO to the voltage control unit 170.

The FCFO detection unit 160 detects an FCFO based on autocorrelation using the CP included in the obtained baseband signal. The FCFO detection unit 160 outputs the detected FCFO to the voltage control unit 170.

The voltage control unit 170 outputs a control voltage that determines the reference frequency of the VC-TCXO 180, in accordance with the ICFO obtained from the ICFO detection unit 150 and the FCFO obtained from the FCFO detection unit 160. The voltage control unit 170 performs digital control of the control voltage to be input to the VC-TCXO 180, in accordance with the code having a predetermined number of bits. The voltage control unit 170 includes a control unit 171 and a DAC 172.

The control unit 171 generates digital data having a predetermined number of bits as a value determining a control voltage value given to the DAC 172, in accordance with the obtained ICFO and FCFO, and outputs the data to the DAC 172. The control unit 171 first narrows the range of reference voltage to be applied to the DAC 172, in accordance with the ICFO, and changes the reference voltage range of the DAC 172 accordingly. The control unit 171 then associates the determined reference voltage range to control code values having the predetermined number of bits. The control unit 171 next obtains a CFO from the ICFO and the FCFO. The control unit 171 finally determines the code value to be output as a control voltage value for correcting the CFO and outputs the determined code value to the DAC 172.

The reference voltage range of the DAC 172 is changed by the control unit 171. The DAC 172 receives the code value output from the control unit 171 and outputs to the VC-TCXO 180 a control voltage corresponding to the code value within the applied reference voltage range.

The VC-TCXO 180 is a VC-TCXO of voltage control type. The VC-TCXO 180 controls the oscillation frequency of the reference signal in accordance with the control voltage input from the voltage control unit 170, generates a reference signal of a target frequency with the CFO corrected, and outputs the signal to the radio frequency conversion PLL 190.

The radio frequency conversion PLL 190 generates an oscillator signal of a desired frequency, in accordance with the reference signal input from the VC-TCXO 180, and outputs the signal to the mixer 130.

Figure 4:
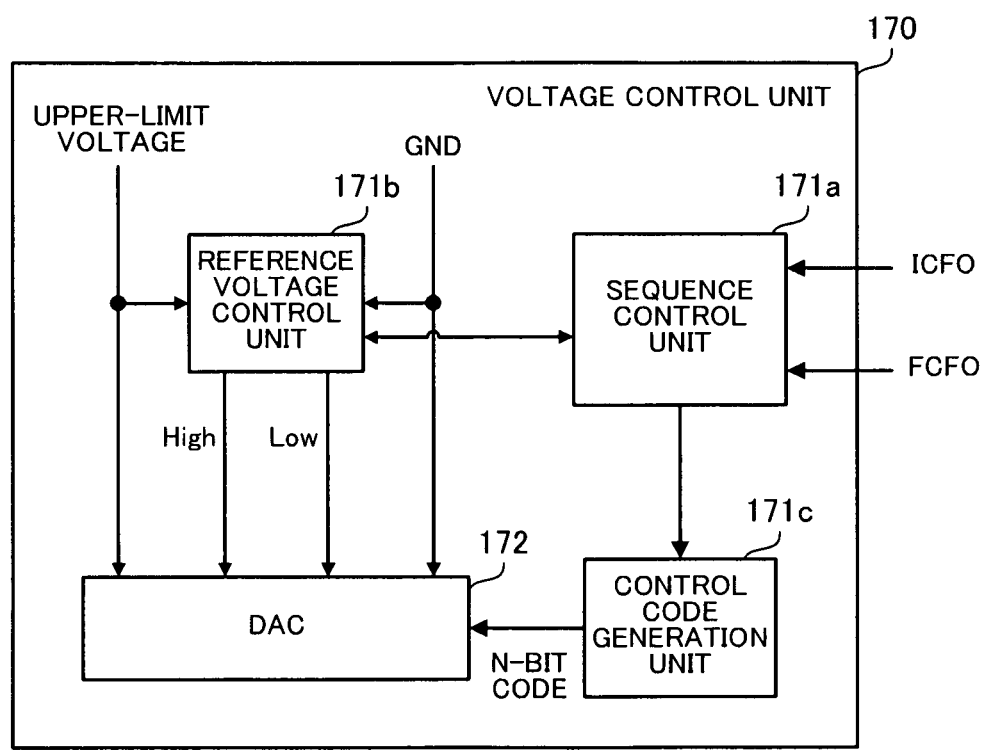
FIG. 4 is a block diagram illustrating the functions of a voltage control unit of the first embodiment.

FIG. 4 is a block diagram illustrating the functions of the voltage control unit 170 of the first embodiment. The voltage control unit 170 includes a sequence control unit 171a, a reference voltage control unit 171b, a control code generation unit 171c, and a DAC 172. The control unit 171 illustrated in FIG. 3 includes the sequence control unit 171a, the reference voltage control unit 171b, and the control code generation unit 171c.

The sequence control unit 171a obtains the ICFO and the FCFO. The sequence control unit 171a outputs the obtained ICFO to the reference voltage control unit 171b. When notified by the reference voltage control unit 171b that the reference voltage range of the DAC 172 has been changed, the sequence control unit 171a outputs the CFO obtained from the ICFO and the FCFO, to the control code generation unit 171c.

On the basis of the ICFO obtained from the sequence control unit 171a, the reference voltage control unit 171b changes the range of the reference voltage to be applied to the DAC 172, within the range from the reference voltage (GND) applied beforehand, to an upper-limit voltage.

The control code generation unit 171c generates a code value having the predetermined number of bits as a control voltage value to be output to the DAC 172, in accordance with the CFO obtained from the sequence control unit 171a, so that a CFO-corrected reference signal is output to the VC-TCXO 180. The control code generation unit 171c outputs the generated code value to the DAC 172.

The DAC 172 has the same function as that described with reference to FIG. 3, and a description thereof is omitted here.

Figure 5:
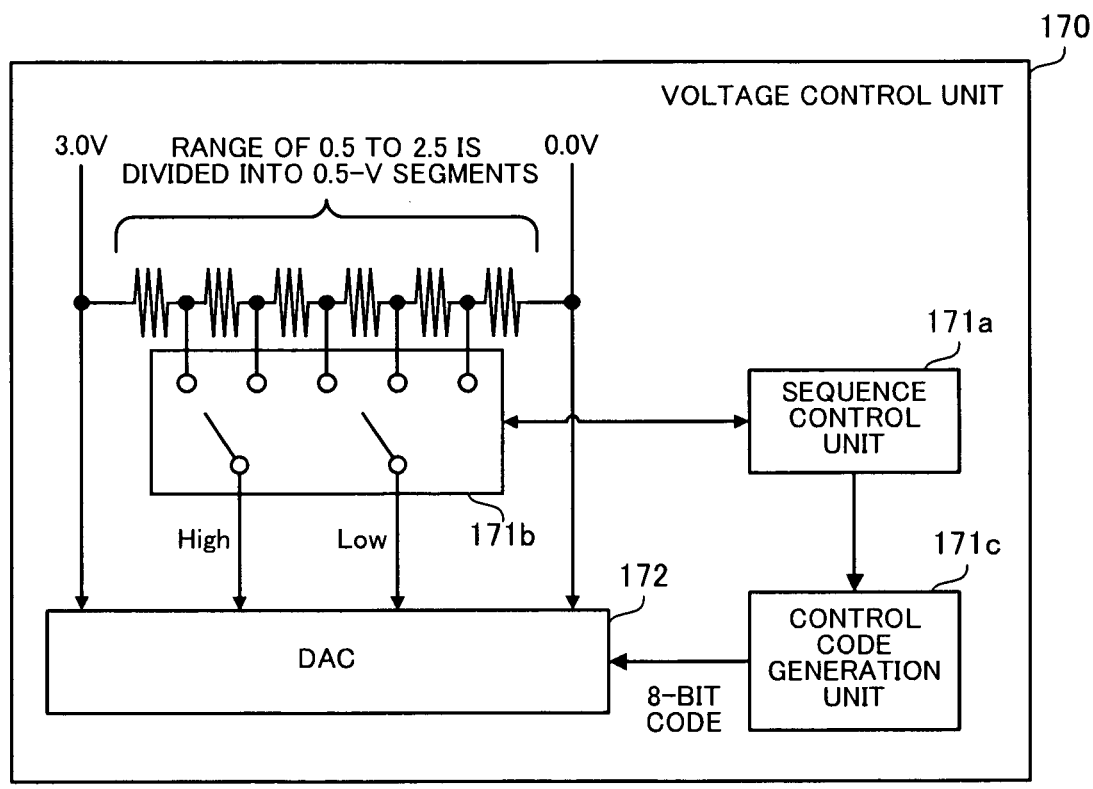
FIG. 5 illustrates an example of a reference voltage control unit of the first embodiment.

FIG. 5 illustrates an example of the reference voltage control unit 171b of the first embodiment. The reference voltage control unit 171b adjusts the reference voltage by applying the upper-limit voltage (High) and a lower-limit voltage (Low) obtained through resistance voltage division to the DAC 172. In this embodiment, the reference voltage control unit 171b can adjust the reference voltage range of the DAC 172 further to any of three ranges: 0.5 to 1.5 V, 1.0 to 2.0 V, and 1.5 to 2.5 V.

The DAC 172 has a resolution of eight bits for the three ranges. The control code generation unit 171c outputs an eight-bit control code value to the DAC 172.

Figure 6:
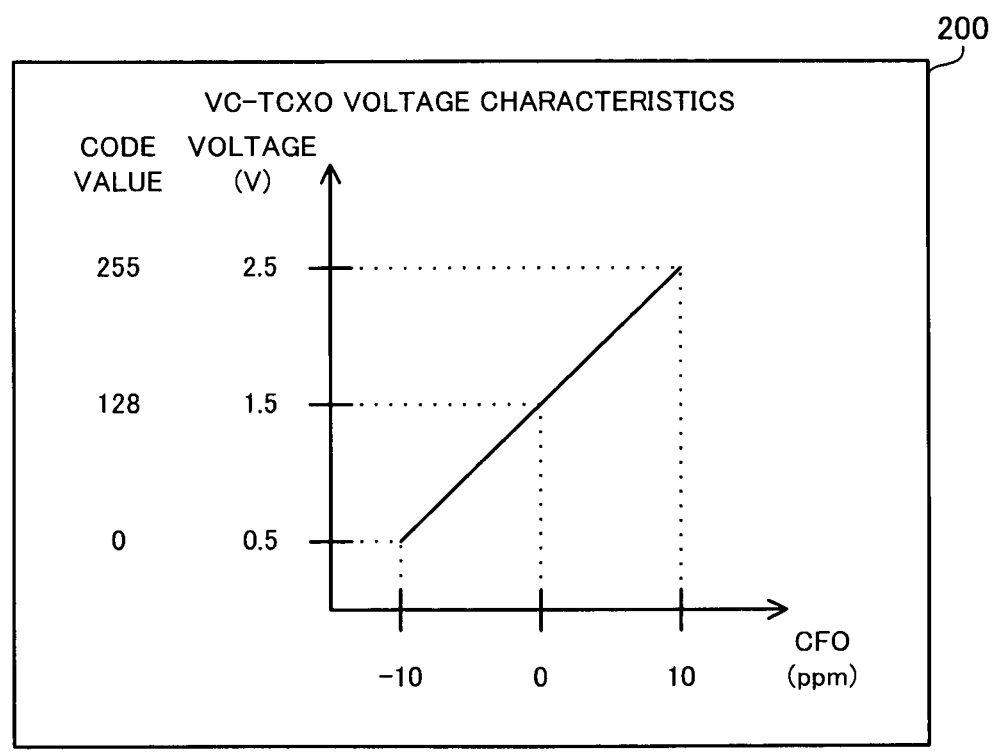
FIG. 6 illustrates voltage characteristics of a VC-TCXO of the first embodiment.

FIG. 6 illustrates the voltage characteristics of the VC-TCXO 180 of the first embodiment. A voltage characteristics diagram 200 illustrates the linear characteristics of the control voltage to be given to the VC-TCXO 180, with respect to the oscillation frequency of the reference signal that can be output by the VC-TCXO 180. In the voltage characteristics diagram 200, the horizontal axis represents a correctable CFO, and the vertical axis represents an input control voltage value (voltage (V) in the figure). The CFO on the horizontal axis is expressed in ppm units, and an oscillation frequency after correction in a range of −10 to +10 ppm is illustrated. The control voltage value on the vertical axis is expressed in volts (V), and a control voltage which the VC-TCXO 180 needs to output the CFO-corrected oscillation frequency on the horizontal axis is illustrated. Specifically, FIG. 6 illustrates that a control voltage of 0.5 V needs to be input to correct a CFO of −10 ppm and that a control voltage of 2.5 V needs to be input to correct a CFO of 10 ppm, with respect to the oscillation frequency.

The voltage characteristics diagram 200 also illustrates a control code value given to the DAC 172, the code being needed to output the control voltage value to the VC-TCXO 180. In the voltage characteristics diagram 200, a code value "0" is needed to cause the DAC 172 to output a lower-limit control voltage value of 0.5 V, and a code value "255" is needed to cause the DAC 172 to output an upper-limit control voltage value of 2.5 V. By inputting an eight-bit control code value in the range of "0" to "255" to the DAC 172, the output of a control voltage value obtained by dividing the reference voltage range of 0.5 to 2.5 V equally into 256 parts can be specified.

The voltage control unit 170 has code conversion tables as described below.

FIG. 7 illustrates example data of the code conversion tables in the first embodiment. Code conversion tables 170a, 170b, and 170c list control code values to be given to the DAC 172 in accordance with the CFO. The code conversion tables 170a, 170b, and 170c are stored beforehand in a memory (not illustrated in FIG. 3) included in the voltage control unit 170. The code conversion tables 170a, 170b, and 170c are referenced by the reference voltage control unit 171b and the control code generation unit 171c and are used to determine the reference voltage range of the DAC 172 or the control code value to be output to the DAC 172. The code conversion table 170a is referenced when the reference voltage range of the DAC 172 is from 0.5 to 1.5 V. The code conversion table 170b is referenced when the reference voltage range of the DAC 172 is from 1.0 to 2.0 V. The code conversion table 170c is referenced when the reference voltage range of the DAC 172 is from 1.5 to 2.5 V.

The code conversion tables 170a, 170b, and 170c have columns of No., CFO (ppm), and code. Items in the same row are associated with one another and form a unit of information concerning a single code conversion.

An item number is specified in the "No." column. A CFO representing a frequency offset amount is specified in ppm units in the "CFO (ppm)" column. A control code value to be given to the DAC 172 in accordance with the CFO is specified in the "code" column.

Suppose that the code conversion table 170a has information No. 2 associated with a CFO (ppm) of "−9.961" and a code of "1". This means that a control code value of "1" needs to be input to the DAC 172, in order to correct the frequency by −9.961 ppm.

When determining the reference voltage of the DAC 172, the reference voltage control unit 171b infers which one of the code conversion tables 170a, 170b, and 170c contains a CFO correction value considering an FCFO, in accordance with the ICFO. The reference voltage control unit 171b then applies the upper-limit and lower-limit reference voltages corresponding to the inferred code conversion table, to the DAC 172. For example, if the ICFO is 7 ppm, the reference voltage control unit 171b selects the code conversion table 170c and determines that the lower-limit and upper-limit reference voltages of the DAC 172 are 1.5 V and 2.5 V, respectively. If the ICFO is in the range of −5 to +5 ppm, the reference voltage control unit 171b selects any of the code conversion tables 170a, 170b, and 170c in accordance with predetermined conditions.

The mobile station 100 having the structure and data structure as described determines a control voltage to be given to the VC-TCXO 180, following a procedure as described below in detail.

In the description given below, a carrier frequency interval of "1" is converted to 1 ppm, in the interests of simplicity.

Figure 8:
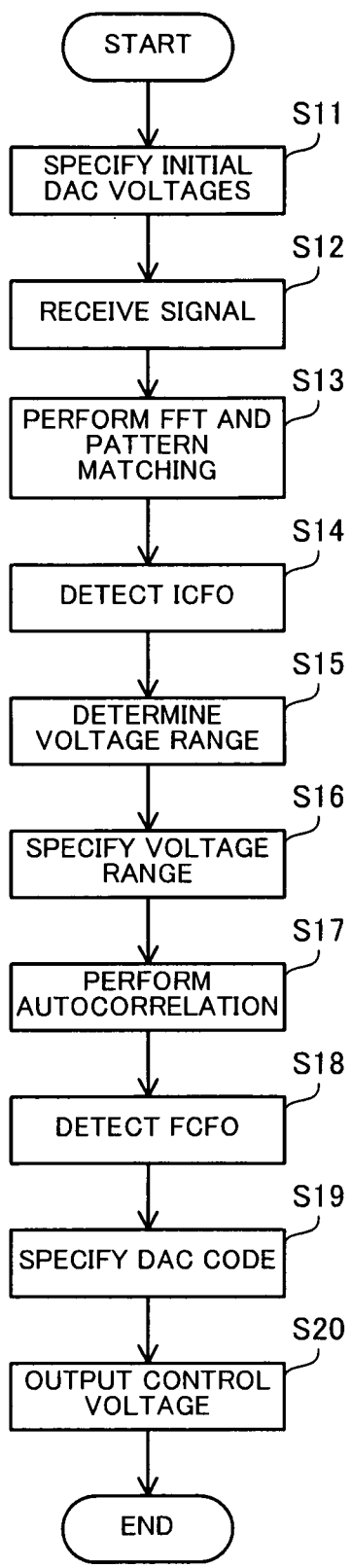
FIG. 8 is a flowchart illustrating a procedure for determining a control voltage to be given to the VC-TCXO in the first embodiment.

FIG. 8 is a flowchart illustrating the procedure for determining a control voltage to be given to the VC-TCXO 180 in the first embodiment. Individual steps illustrated in FIG. 8 will be described in ascending order of step number.

Step S11: The reference voltage control unit 171b specifies initial lower-limit reference voltage and upper-limit reference voltage to be applied to the DAC 172 to 0.5 V and 2.5 V, respectively.

Step S12: The antenna 110 outputs a signal received from the wireless base station 20, to the receiving unit 120. The received signal is converted to a baseband signal through the receiving unit 120, the mixer 130, and the LPF 140. The baseband signal is output to the ICFO detection unit 150 and the FCFO detection unit 160.

Step S13: The ICFO detection unit 150 performs a fast Fourier transform of a preamble signal included in the obtained baseband signal, at the frequency reference range of the preamble signal. The ICFO detection unit 150 performs pattern matching between a known frequency pattern and a frequency pattern based on the result of the fast Fourier transform.

Step S14: In accordance with the result of the pattern matching in step S13, the ICFO detection unit 150 detects an ICFO. The ICFO detection unit 150 outputs the detected ICFO to the voltage control unit 170.

Step S15: The sequence control unit 171a outputs the ICFO obtained from the ICFO detection unit 150 to the reference voltage control unit 171b. The reference voltage control unit 171b selects any of the code conversion tables 170a, 170b, and 170c that allows the CFO including the FCFO to be corrected, in accordance with the obtained ICFO. If the ICFO is within a range of −2 to +2 ppm, the reference voltage control unit 171b selects the code conversion tables 170b and specifies a reference voltage range of 1.0 to 2.0 V. If the ICFO is smaller than −2 ppm, the sequence control unit 171a selects the code conversion table 170a. If the ICFO is greater than +2 ppm, the sequence control unit 171a selects the code conversion table 170c. The reference voltage range is determined in accordance with the selected code conversion table.

Step S16: The reference voltage control unit 171b changes the upper limit and lower limit of the reference voltage range of the DAC 172, in accordance with the reference voltage range selected in step S15.

Step S17: The FCFO detection unit 160 calculates a phase shift amount of the received signal by autocorrelation using the CP contained in the baseband signal.

Step S18: The FCFO detection unit 160 detects an FCFO in accordance with the result of calculation obtained in step S17. The FCFO detection unit 160 outputs the detected FCFO to the voltage control unit 170.

Step S19: The sequence control unit 171a obtains a CFO from the obtained ICFO and FCFO. The sequence control unit 171a outputs the CFO to the control code generation unit 171c. The control code generation unit 171c determines a control code value to be output to the DAC 172, in accordance with the CFO obtained from the sequence control unit 171a and the selected code conversion table. The control code generation unit 171c outputs the control code value to the DAC 172.

Step S20: The DAC 172 outputs to the VC-TCXO 180 a control voltage in accordance with the control code value obtained from the control code generation unit 171c.

Steps S17 and S18 may be executed in parallel with steps S13 and S14 and may also be executed prior to steps S13 and S14.

By repeating the procedure of steps S11 to S20, the precision of frequency adjustment can be improved.

To provide a description below more specifically, suppose that a carrier frequency interval of "1" is converted to 1 ppm, and the CFO between the wireless base station 20 and the mobile station 100 is 5.5 ppm, where the ICFO is 5 ppm, and the FCFO is 0.5 ppm.

Figure 9:
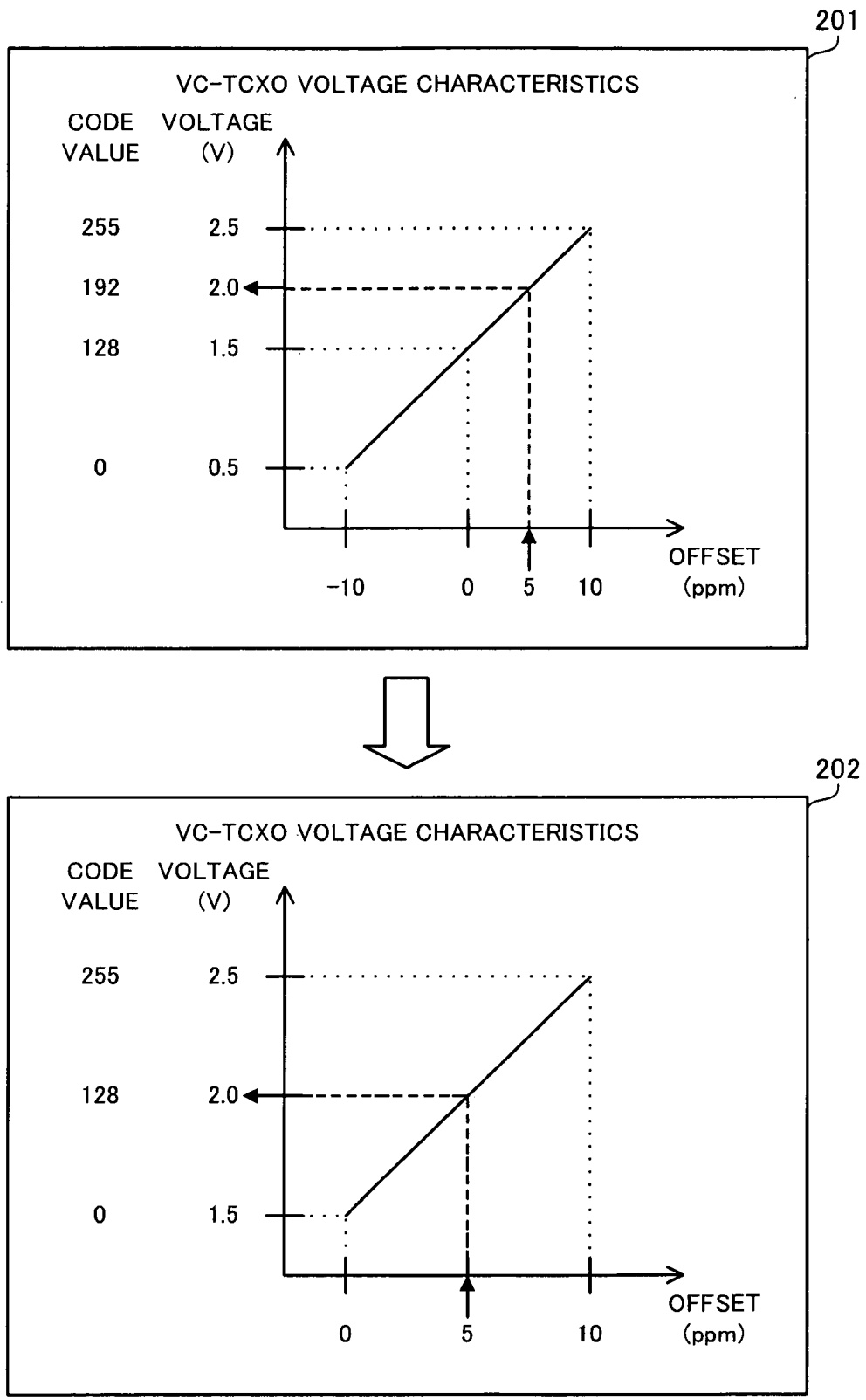
FIG. 9 illustrates a relationship between a control code value and a reference voltage of a DAC in the first embodiment.

FIG. 9 illustrates the relationship between the control code value and the reference voltage of the DAC in the first embodiment. A voltage characteristics diagram 201 illustrates the relationship between the control voltage value and the code value when the ICFO detection unit 150 detects an ICFO of 5 ppm with respect to the initially-specified reference voltage. The voltage characteristics diagram 201 illustrates that when the ICFO is 5 ppm, a control voltage value of 2.0 V is selected for the DAC 172, and a corresponding control code value for the DAC 172 is "192".

The resolution of CFO correction in the voltage characteristics diagram 201 is $20/256 \approx 0.078$ (ppm/code).

The reference voltage control unit 171b selects the code conversion table 170c and specifies the reference voltage range of the DAC 172 to 1.5 to 2.5 V. A voltage characteristics diagram 202 illustrates the corresponding voltage characteristics of the VC-TCXO 180. In the voltage characteristics diagram 202, a control code value to be given to the DAC 172 is 128 when the ICFO is 5 ppm.

Figure 10:
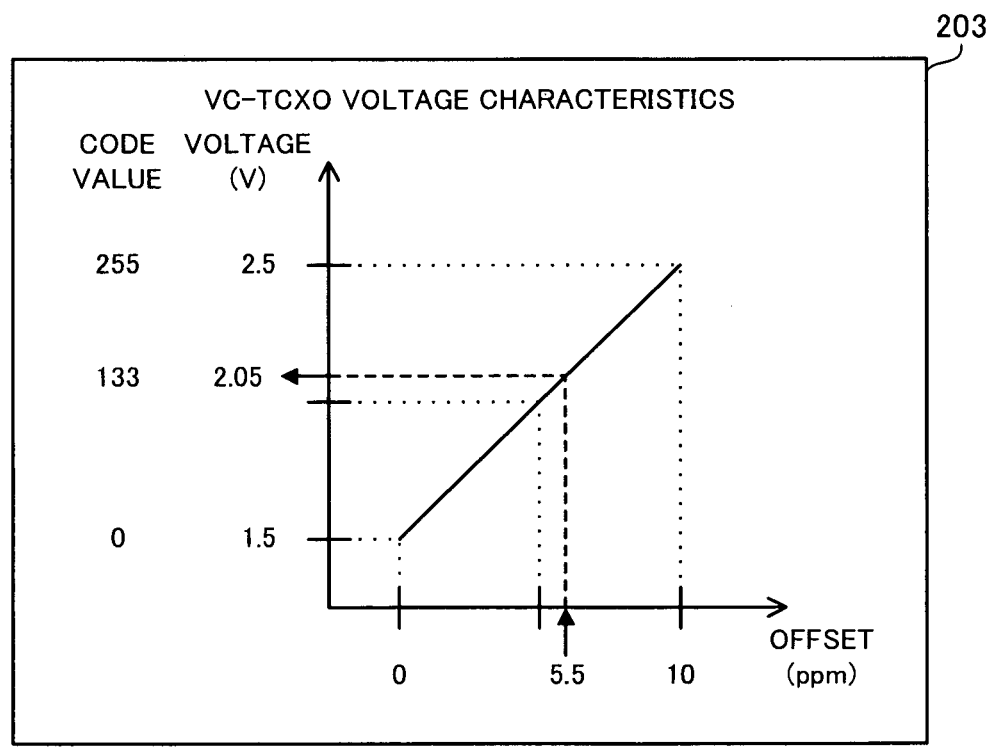
FIG. 10 illustrates a code value to be input to the DAC in accordance with a central frequency offset (CFO)

FIG. 10 illustrates the code value to be input to the DAC 172 in accordance with the CFO. As in the voltage characteristics diagram 202 illustrated in FIG. 9, the reference voltage range of the DAC 172 is specified to 1.5 to 2.5 V in FIG. 10. A voltage characteristics diagram 203 illustrates the relationship between the control voltage value and the code value when the ICFO is 5 ppm and the FCFO is 0.5 ppm, that is, when the CFO is 5.5 ppm. A control voltage value to be given to the VC-TCXO 180 is 2.05 V when the CFO is 5.5 ppm, and accordingly, the control code generation unit 171c inputs a control code value "133" to the DAC 172.

The resolution of CFO correction in the voltage characteristics diagram 202 or 203 is $10/256 \approx 0.039$ (ppm/code).

The reference voltage control unit 171b narrows the reference voltage range of the DAC 172 to be used for frequency correction, in accordance with the ICFO. The control code generation unit 171c outputs a control code value associated with the narrowed reference voltage range, to the DAC 172. The DAC 172 outputs a control voltage corresponding to the control code value in the narrowed reference voltage range, to the VC-TCXO 180. Therefore, the resolution of control voltage output by the DAC 172 can be improved without changing the number of bits used in the control code. The correction resolution of the oscillation frequency of the reference signal by the VC-TCXO 180 can also be improved.

For a code conversion table that allows the covered voltage range to be narrowed (such as the code conversion table 170b), the resolution of control voltage in the range can be improved further by associating code conversion with a narrower reference voltage range.

Since the resolution of the control voltage of the DAC 172 can be improved without increasing the number of bits used by the code value to be input to the DAC 172, the circuit does not need to be scaled up.

Second Embodiment

A second embodiment will be described next in detail with reference to drawings. Points where the second embodiment differs from the first embodiment will be described mainly, and a description of common features will be omitted.

A mobile communication system of the second embodiment can be implemented by the same system structure as the mobile communication system of the first embodiment illustrated in FIG. 2. The mobile station in the second embodiment can be implemented by the same module structure as the mobile station 100 illustrated in FIG. 3. Just the control range of the reference voltage of the DAC is different. The second embodiment will be described by using the same reference symbols as used in the first embodiment.

FIG. 11 illustrates example data of code conversion tables of the second embodiment. Code conversion tables 170d, 170e, 170f, and 170g specify the code value to be input to the DAC 172 in accordance with the CFO. The code conversion tables 170d, 170e, 170f, and 170g are stored beforehand in the memory included in the voltage control unit 170, together with the code conversion tables 170a, 170b, and 170c illustrated in FIG. 7. The code conversion tables 170d, 170e, 170f, and 170g are referenced by the reference voltage control unit 171b and used to determine the reference voltage range of the DAC 172 and the control code value output to the DAC 172. The code conversion table 170d is referenced when the reference voltage range of the DAC 172 is from 0.5 to 1.0 V. The code conversion table 170e is referenced when the reference voltage range of the DAC 172 is from 1.0 to 1.5 V. The code conversion table 170f is referenced when the reference voltage range of the DAC 172 is from 1.5 to 2.0 V. The code conversion table 170g is referenced when the reference voltage range of the DAC 172 is from 2.0 to 2.5 V. The code conversion tables 170d, 170e, 170f, and 170g have the same structure as the code conversion tables 170a, 170b, and 170c illustrated in FIG. 7, and a description of the structure will be omitted.

The code conversion tables provided additionally in the second embodiment correspond to smaller segments split from the reference voltage range. If predetermined conditions based on the ICFO value are satisfied, the corresponding additional code conversion table will be selected.

The voltage characteristics of the VC-TCXO 180 are the same as those illustrated in the voltage characteristics diagram 200 in FIG. 6 of the first embodiment.

To make the following description easy to understand, it is assumed that a carrier frequency interval of "1" is converted to 1 ppm, as in the first embodiment.

The mobile station 100 having the structure and data structure as described above determines a control voltage to be given to the VC-TCXO 180, following a procedure described below in detail.

Figure 12:
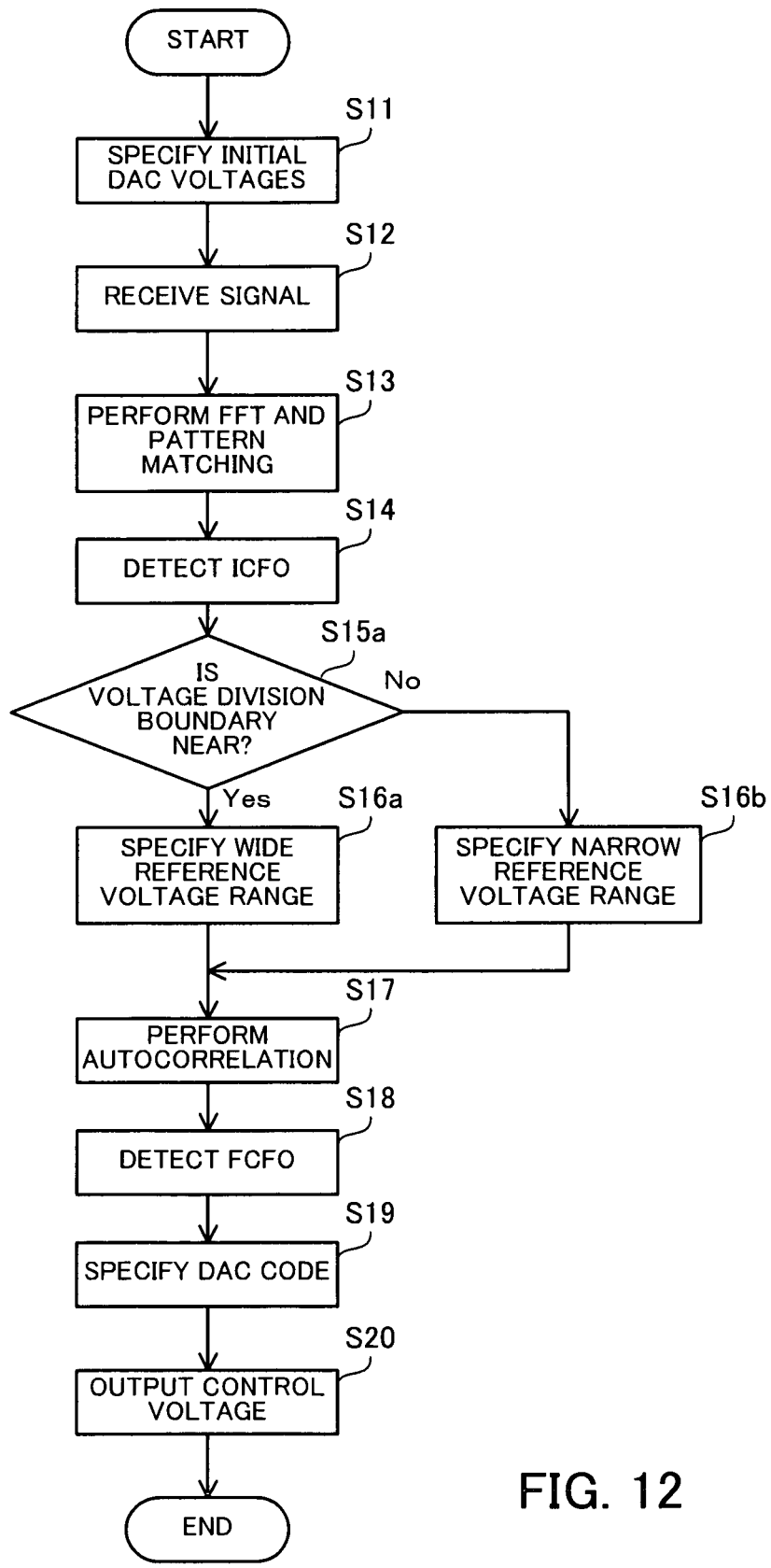
FIG. 12 is a flowchart illustrating a procedure for determining a control voltage to be given to a VC-TCXO in the second embodiment.

FIG. 12 is a flowchart illustrating the procedure for determining a control voltage to be given to the VC-TCXO 180 in the second embodiment. Individual steps illustrated in FIG. 12 will be described in ascending order of step number. Steps S11 to S14 and steps S17 to S20 are the same as the steps denoted by identical step numbers in FIG. 8, and a description of those steps will be omitted.

Step S15a: The sequence control unit 171a outputs the ICFO obtained from the ICFO detection unit 150, to the reference voltage control unit 171b. The reference voltage control unit 171b judges whether the control voltage value corresponding to the obtained ICFO is in the vicinity of a boundary of resistance voltage division (1.0 V, 1.5 V, or 2.0 V). If yes, the processing proceeds to step S16a. If not, the processing proceeds to step S16b.

Step S16a: The reference voltage control unit 171b selects any of the code conversion tables 170a, 170b, and 170c, corresponding to wide reference voltage ranges. The reference voltage control unit 171b specifies the upper and lower limits of the reference voltage of the DAC 172, in accordance with the selected code conversion table.

Step S16b: The reference voltage control unit 171b selects any of the code conversion tables 170d, 170e, 170f, and 170g, corresponding to narrow reference voltage ranges. The reference voltage control unit 171b specifies the upper and lower limits of the reference voltage of the DAC 172, in accordance with the selected code conversion table.

Whether the value is in the vicinity of a boundary can be judged in step S15a by inferring whether a correction can be made in the selected reference voltage range if the ICFO is considered. For example, supposing that a range of ±0.1 V (corresponding to ±1 ppm in this embodiment) is permitted on each boundary, it is judged whether the ICFO is included in the permissible range near each boundary of resistance voltage division. It is judged that the ICFO is in the vicinity of a boundary of resistance voltage division, as follows: (1) If the ICFO is within a range of −6 to −4 ppm, it is judged that the value is in the vicinity of a control voltage value of 1.0 V. (2) If the ICFO is within a range of −1 to +1 ppm, it is judged that the value is in the vicinity of a control voltage value of 1.5 V. (3) If the ICFO is within a range of +4 to +6 ppm, it is judged that the value is in the vicinity of a control voltage value of 2.0 V.

As described above, the reference voltage control unit 171*b* narrows the reference voltage range of the DAC 172. This can improve the resolution of the control voltage output by the DAC 172, under predetermined conditions.

To be more specific, in the description given below, it is supposed that a carrier frequency interval of "1" is converted to 1 ppm and that the CFO between the wireless base station 20 and the mobile station 100 is 7.5 ppm, where the ICFO is 7 ppm, and the FCFO is 0.5 ppm.

Figure 13:
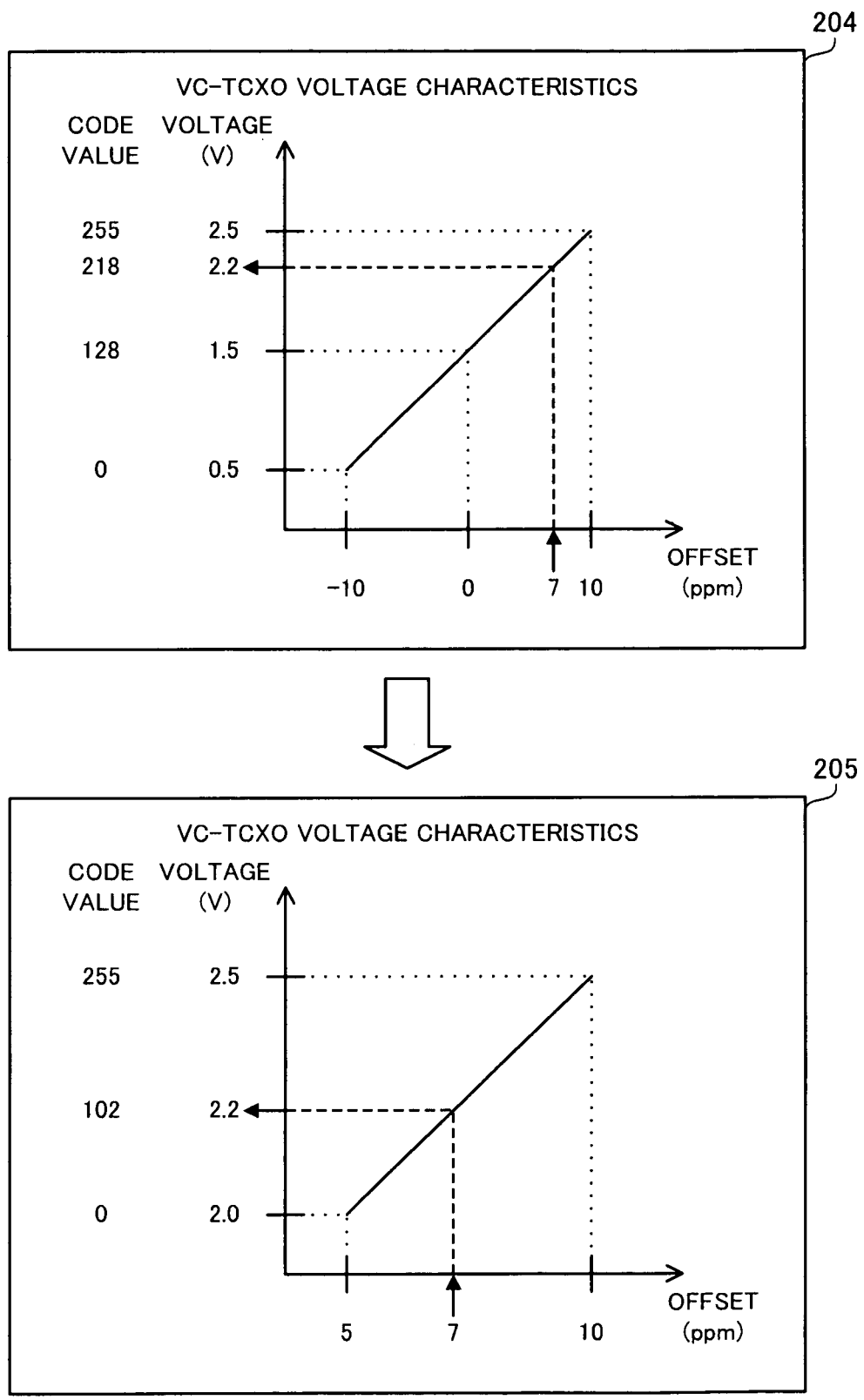
FIG. 13 illustrates a relationship between a control code value and a reference voltage of a DAC in the second embodiment.

FIG. 13 illustrates the relationship between the control code value and the reference voltage of the DAC 172 of the second embodiment. A voltage characteristics diagram 204 illustrates the relationship between the control voltage value and the code value when the ICFO detected by the ICFO detection unit 150 is 7 ppm with respect to the initial reference voltage. When the ICFO is 7 ppm, a control voltage value of 2.2 V is selected for the DAC 172, and a control code value "218" is given to the DAC 172 accordingly.

The resolution of CFO correction in the voltage characteristics diagram 204 is $20/256 \approx 0.078$ (ppm/code).

The reference voltage control unit 171*b* selects the code conversion table 170*g* and specifies the reference voltage range of the DAC 172 to 2.0 to 2.5 V. A voltage characteristics diagram 205 illustrates the corresponding voltage characteristics of the VC-TCXO 180. In the voltage characteristics diagram 205, when the ICFO is 7 ppm, a control code value to be given to the DAC 172 is 102.

Figure 14:
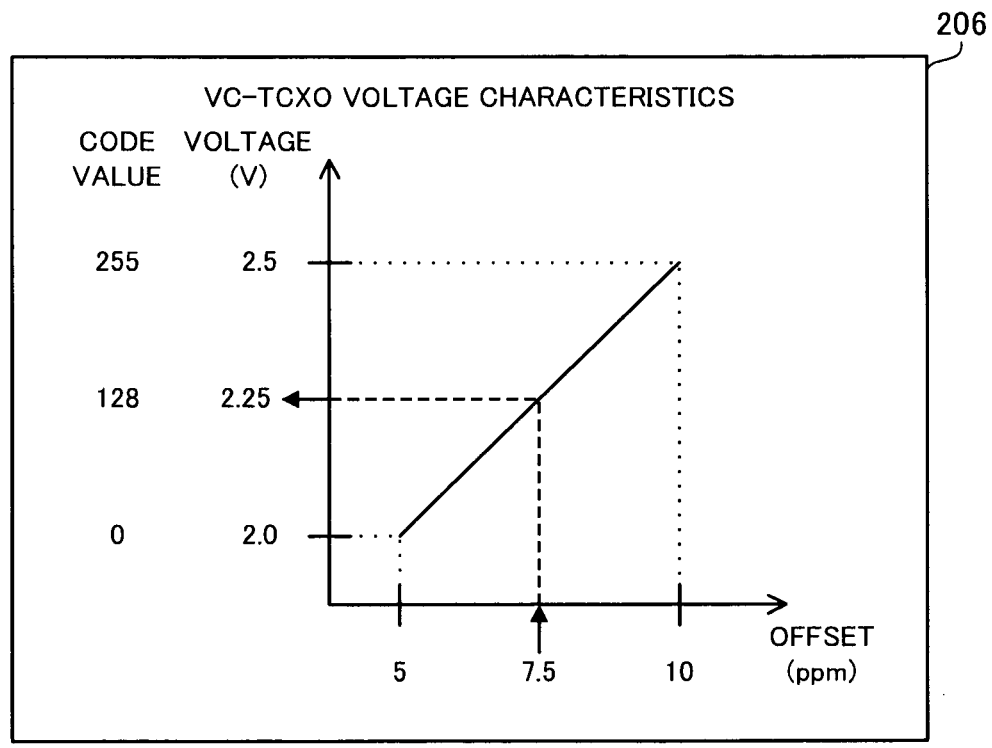
FIG. 14 illustrates a code value to be input to the DAC in accordance with a CFO.

FIG. 14 illustrates the code value input to the DAC in accordance with the CFO. Like the voltage characteristics diagram 205 illustrated in FIG. 13, FIG. 14 illustrates the relationship when the reference voltage range of the DAC 172 is specified to 2.0 to 2.5 V. A voltage characteristics diagram 206 illustrates the relationship between the control voltage value and the code value when the ICFO is 7 ppm and the FCFO is 0.5 ppm. When the CFO is 7.5 ppm, the control voltage value to be given to the VC-TCXO 180 is 2.25 V. For that purpose, the control code generation unit 171*c* inputs a control code value "128" to the DAC 172.

The resolution of CFO correction is $5/256 \approx 0.0195$ (ppm/code) in the voltage characteristics diagrams 205 and 206.

The reference voltage control unit 171*b* selects a narrow reference voltage range of the DAC 172, in accordance with the ICFO value, for frequency correction. The control code generation unit 171*c* associates the control code value with the narrowed reference voltage range and outputs a control code value for correcting the CFO, to the DAC 172. The DAC 172 outputs a control voltage corresponding to the control code value, within the narrowed reference voltage range, to the VC-TCXO 180. Accordingly, in comparison with the first embodiment, the resolution of the control voltage output from the DAC 172 can be improved further, without changing the number of bits used in the control code. The correction resolution of the oscillation frequency of the reference signal by the VC-TCXO 180 can also be improved.

Figure 15:
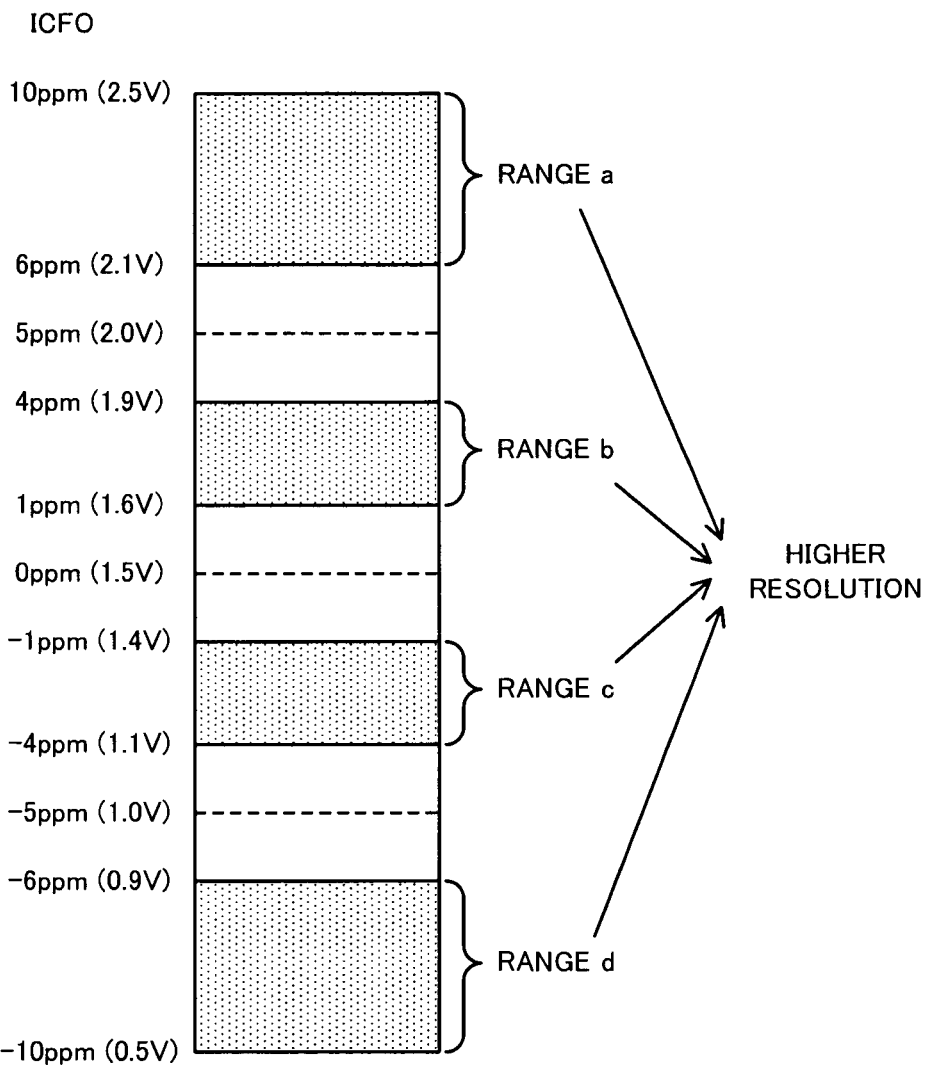
FIG. 15 is a diagram illustrating the range of integer CFO (ICFO) where a narrow reference voltage range can be selected.

FIG. 15 is a diagram illustrating the range of ICFO where a narrow reference voltage range can be selected. FIG. 15 illustrates a range where the CFO can be specified with a higher resolution. In FIG. 15, the CFO ranging from −10 to +10 ppm is illustrated in increments of 5 ppm. The corresponding control voltage value to be given to the VC-TCXO 180 for correcting the CFO is indicated in the parentheses.

If the detected ICFO is not in the vicinity of a boundary of resistance voltage division (1.0 V, 1.5 V, or 2.0 V), that is, if the detected ICFO is in any of the ranges a to d, a higher resolution can be implemented by using the code conversion table 170*d*, 170*e*, 170*f*, or 170*g*. The ranges a to d can be specified as necessary, depending on the environment and precision requirements.

Although the mobile station 100 described above converts the signal received from the wireless base station 20 to the baseband signal directly, the embodiments can be applied to the correction of frequency of the reference signal in a wireless receiver which converts the received signal into the intermediate frequency band.

With the oscillating apparatus, the receiving apparatus, and the oscillation control method described above, the precision of oscillation frequency control can be improved.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that various changes, substitutions, and alterations could be made hereto without departing from the sprit and scope of the invention.

What is claimed is:

1. An oscillating apparatus which controls an oscillation frequency in accordance with an input signal, the oscillating apparatus comprising:
    a detection unit which detects a frequency offset between the input signal and a reference signal, the frequency offset comprising a first frequency offset and a second frequency offset, wherein the detection unit includes: a first detection unit configured to detect the first frequency offset and a second detection unit configured to detect the second frequency offset;
    a voltage control unit which converts the frequency offset detected by the detection unit to a value of a code having a predetermined number of bits, and converts the value of the code to a value of a voltage; and
    a voltage-controlled oscillator which controls an oscillation frequency thereof in accordance with the value of the voltage obtained by the voltage control unit;
    wherein the voltage control unit changes, based on a portion of the detected frequency offset, a range of values of the frequency offset which are to be converted to different values of the code with the predetermined number of bits, as well as changes a range of values of the voltage which are to be converted from the different values of the code having the predetermined number of bits.

2. The oscillating apparatus according to claim 1, wherein the voltage control unit includes a plurality of resistors to set the range of values of the voltage.

3. The oscillating apparatus according to claim 1, wherein the voltage control unit has a plurality of patterns of code conversion information indicating relationship between the value of the code having the predetermined number of bits and the frequency offset, and selects one of the patterns of code conversion information to be used, in accordance with the portion of the detected frequency offset.

4. The oscillating apparatus according to claim 1, wherein the voltage control unit determines a width of the range of values of the voltage and a width of the range of values of the frequency offset in accordance with the portion of the detected frequency offset.

5. The oscillating apparatus according to claim 1, wherein the detection unit includes:
wherein the first detection unit is configured to detect the first frequency offset by detecting the frequency offset with a predetermined precision; and
the second detection unit is configured to detect the second frequency offset by detecting the frequency offset with a higher precision than the first detection unit; and
wherein the voltage control unit changes the range of values of the frequency offset and voltage in accordance with a detection result of the first detection unit and obtains the voltage to be applied to the voltage controlled oscillator, in accordance with the changed range and a detection result of the second detection unit.

6. The oscillating apparatus according to claim 5, wherein the first detection unit detects the first frequency offset by detecting a known signal included in the input signal, in the frequency domain.

7. The oscillating apparatus according to claim 5, wherein the second detection unit detects the second frequency offset by identifying a phase shift amount in the time domain in accordance with a guide interval included in the input signal.

8. A receiving apparatus which performs automatic frequency control in accordance with a received signal, the receiving apparatus comprising:
a detection unit which detects a frequency offset between the input signal and a reference signal, the frequency offset comprising a first frequency offset and a second frequency offset, wherein the detection unit includes: a first detection unit configured to detect the first frequency offset and a second detection unit configured to detect the second frequency offset;
a voltage control unit which converts the frequency offset detected by the detection unit to a value of a code having a predetermined number of bits, and converts the value of the code to a value of a voltage; and
a voltage controlled oscillator which controls an oscillation frequency thereof in accordance with the value of the voltage obtained by the voltage control unit;
wherein the voltage control unit changes, based on a portion of the detected frequency offset, a range of values of the frequency offset which are to be converted to different values of the code with the predetermined number of bits, as well as changes a range of values of the voltage which are to be converted from the different values of the code having the predetermined number of bits.

9. An oscillation control method which controls an oscillation frequency of a voltage controlled oscillator in accordance with an input signal, the oscillation control method comprising:
detecting a frequency offset between the input signal and a reference signal, the frequency offset comprising a first frequency offset and a second frequency offset, and the detecting includes: detecting the first frequency offset and detecting the second frequency offset;
converting the detected frequency offset to a value of a code having a predetermined number of bits;
converting the value of the code to a value of a voltage;
applying the value of the voltage to the voltage controlled oscillator to control the oscillation frequency thereof; and
changing, based on a portion of the detected frequency offset, a range of values of the frequency offset which are to be converted to different values of the code with the predetermined number of bits, as well as changing a range of values of the voltage which are to be converted from the different values of the code having the predetermined number of bits.

10. An oscillating apparatus which controls an oscillation frequency by detecting a frequency offset between an input signal and a reference signal, converting the frequency offset to a code having a predetermined number of bits, converting the code having the predetermined number of bits to a voltage, and applying the voltage to a voltage controlled oscillator, the oscillating apparatus comprising:
a voltage control unit which specifies a relationship among the code having the predetermined number of bits, the frequency offset, and the voltage, in accordance with a detection state of the frequency offset;
a first detection unit configured to detect the frequency offset with a predetermined precision; and
a second detection unit configured to detect the frequency offset with a higher precision than the first detection unit;
wherein the voltage control unit specifies the relationship in accordance with a detection result of the first detection unit and obtains the voltage to be applied, in accordance with the specified relationship and a detection result of the second detection unit.

* * * * *